United States Patent
Kroker

(10) Patent No.: US 11,243,257 B2
(45) Date of Patent: Feb. 8, 2022

(54) CONTROL SYSTEM FOR A BATTERY SYSTEM

(71) Applicant: VOLKSWAGEN AKTIENGESELLSCHAFT, Wolfsburg (DE)

(72) Inventor: Thorsten Kroker, Braunschweig (DE)

(73) Assignee: Volkswagen Aktiengesellschaft

( * ) Notice: Subject to any disclaimer, the term of this patent is extended or adjusted under 35 U.S.C. 154(b) by 410 days.

(21) Appl. No.: 16/157,159

(22) Filed: Oct. 11, 2018

(65) Prior Publication Data
US 2019/0120907 A1 Apr. 25, 2019

(30) Foreign Application Priority Data
Oct. 23, 2017 (DE) .................. 10 2017 218 898.7

(51) Int. Cl.
| | |
|---|---|
| *G01R 31/36* | (2020.01) |
| *G01R 31/367* | (2019.01) |
| *B60L 58/10* | (2019.01) |
| *G01R 31/371* | (2019.01) |

(52) U.S. Cl.
CPC .......... *G01R 31/367* (2019.01); *B60L 58/10* (2019.02); *G01R 31/371* (2019.01)

(58) Field of Classification Search
None
See application file for complete search history.

(56) References Cited

U.S. PATENT DOCUMENTS

| | | | | |
|---|---|---|---|---|
| 6,611,860 B1* | 8/2003 | Ying | ...................... | H04L 69/40 |
| | | | | 709/208 |
| 2015/0008931 A1* | 1/2015 | Sugeno | ................... | B60L 50/60 |
| | | | | 324/434 |
| 2015/0307110 A1* | 10/2015 | Grewe | ................ | B60W 50/029 |
| | | | | 701/36 |
| 2016/0306720 A1* | 10/2016 | Fuhrman | ............. | G06F 11/2038 |

FOREIGN PATENT DOCUMENTS

| | | |
|---|---|---|
| CN | 103332118 A | 10/2013 |
| DE | 10131765 A1 | 1/2003 |
| DE | 102010041492 A1 | 3/2012 |
| DE | 102011117116 A1 | 5/2013 |
| DE | 102012204263 A1 | 9/2013 |
| DE | 102012111991 A1 | 5/2014 |
| DE | 102013217461 A1 | 3/2015 |
| DE | 102014200096 A1 | 7/2015 |
| DE | 102015106193 A1 | 10/2016 |
| WO | 2014060470 A1 | 4/2014 |
| WO | 2016110464 A1 | 7/2016 |
| WO | 2016162624 A1 | 10/2016 |
| WO | 2017085429 A1 | 5/2017 |

* cited by examiner

*Primary Examiner* — Jermele M Hollington
*Assistant Examiner* — Suresh K Rajaputra
(74) *Attorney, Agent, or Firm* — Barnes & Thornburg LLP

(57) ABSTRACT

A monitoring system for a battery system of a transportation vehicle having a primary monitoring device for providing control functions and/or supervisory functions for the battery system and a connecting arrangement for the exchange of control signals and/or supervisory signals with the primary monitoring device, wherein the connecting arrangement is electrically connected to the primary monitoring device and wherein a secondary monitoring device for providing a reduced range of the control functions and/or supervisory functions is electrically connected to the connecting arrangement.

20 Claims, 2 Drawing Sheets

CONTROL SYSTEM FOR A BATTERY SYSTEM

PRIORITY CLAIM

This patent application claims priority to German Patent Application No. 10 2017 218 898.7, filed 23 Oct. 2017, the disclosure of which is incorporated herein by reference in its entirety.

SUMMARY

Illustrative embodiments relate to a monitoring system. Illustrative embodiments further relate to a battery management system, to a transportation vehicle, and also to a method for supervising a battery system.

BRIEF DESCRIPTION OF THE DRAWINGS

Disclosed embodiments are described in detail with reference to the drawings. In this connection, the features mentioned in the claims and in the description may be essential for the disclosed embodiments, in each instance individually by themselves or in arbitrary combination. Shown, in each instance schematically, are:

DETAILED DESCRIPTION

Figure 1:
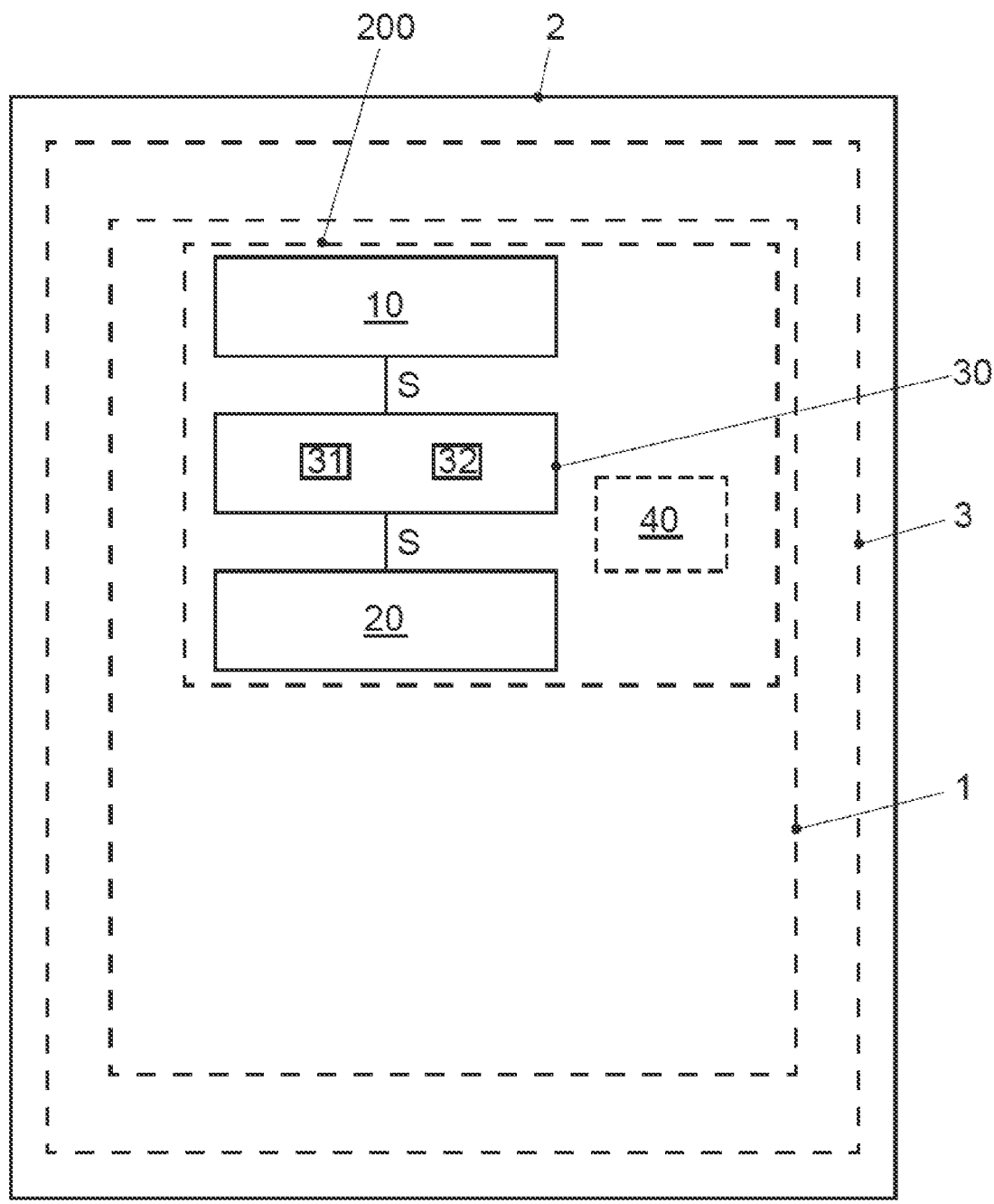
FIG. 1 shows a representation of a disclosed transportation vehicle with a disclosed monitoring system.

It is known from the state of the art that safety functions are provided in battery systems of transportation vehicles, to be able to react to a fault event. Accordingly it is frequently necessary to provide a detection of overvoltage, to register critical voltage states and to be able to initiate measures for guaranteeing safety in the course of operation of the transportation vehicle. In electromobility in particular, complex control systems are employed that exhibit technically elaborate hardware components and software components. This complexity will in future become an ever greater challenge in terms of safety engineering.

Document DE 10 2012 111 991 A1 discloses a driver-assistance system with improved failure safety.

DE 10 2012 204 263 A1 relates to a power-brake system with a brake-actuating unit with at least one sensor for registering the desire of the driver to brake.

WO 2016/110464 A1 discloses an architecture for a driver-assistance system, wherein an emergency stop can be carried out in automated manner.

A drawback of the known solutions is that, for safety-critical applications, for autonomous driving, for instance, the supervision of the battery system is still very elaborate technically and as regards costs, and/or does not conform to the safety-engineering requirements.

Disclosed embodiments propose an improved, fail-safe, and more cost-effective solution for supervising a battery system.

Disclosed embodiments provide a monitoring system, a battery management system, a transportation vehicle, and a method. In this connection, features and details that have been described in connection with the disclosed monitoring system also apply, of course, in connection with the disclosed battery management system, the disclosed transportation vehicle, and also the disclosed method, and conversely in each instance, so that reference will or can always be made reciprocally to the individual features of the disclosed embodiments with respect to the disclosure.

This is achieved by a monitoring system, optionally a supervisory system, for a battery system of a transportation vehicle. The monitoring system may be part of the battery system and/or may be a battery management system. The monitoring system exhibits, for instance, for the purpose of supervising the battery system, at least:

a primary monitoring device for providing monitoring functions—that is to say, at least control functions and/or supervisory functions—for the battery system, optionally for influencing the battery system by utilization of the control functions in a manner depending on a supervision of the battery system by the supervisory functions, a connecting arrangement for the exchange of monitoring signals, in particular, electrical, that is to say, at least control signals and/or supervisory signals—with the primary monitoring device, the connecting arrangement being electrically connected to the primary monitoring device for this purpose.

In this connection, disclosed embodiments provide that a secondary monitoring device for providing a reduced range of the monitoring functions—that is to say, at least control functions and/or supervisory functions—is electrically connected to the connecting arrangement. This means that the secondary monitoring device can serve as emergency monitoring device (in particular, reserve monitoring device) which in the event of failure of the primary monitoring device maintains the availability of the system. In this case, it is possible that the secondary monitoring device is activated only in the event of a technical, functional failure of the primary monitoring device, and otherwise (in the case of orderly operation of the primary monitoring device—that is to say, in the normal state) is in a waiting mode.

By "monitoring" within the context of the disclosure, a supervision and/or control and/or regulation and/or safety measure is understood. A monitoring system and/or a monitoring device can accordingly serve for supervising and/or controlling and/or regulating the functions of a battery system. The monitoring system, in particular, a supervisory system, may in this case be (at least partially) part of a battery system of a transportation vehicle and/or part of an electronics module of the transportation vehicle and/or part of a battery management system, and may, where appropriate, exhibit several electronic components. In this case, respective monitoring devices may have been designed with at least one electronic component, for example, with at least one integrated circuit and/or microcontroller or the like.

It is to be emphasized that the reduced range of the monitoring functions may be a subset of the monitoring functions that are provided by the primary monitoring device. Accordingly, in some cases the same monitoring functions can be provided by the secondary monitoring device as by the primary monitoring device.

Optionally, it is possible that the transportation vehicle is a motor vehicle and/or electric vehicle and/or passenger vehicle and/or hybrid vehicle and/or vehicle driving autonomously. In the field of autonomous driving, an enhanced failure safety is of significance, so here the disclosed monitoring system can enable a distinct enhancement of safety.

It is, furthermore, beneficial in the case of the disclosed monitoring system if the secondary monitoring device is only provided with monitoring functions of the primary monitoring device that are essential. By this, it is meant that the monitoring functions (in particular, as safety functions) are essential for the operation, and/or necessary for the safety in operation, of the battery system and/or transportation vehicle, so that a failure of a respective monitoring function may lead to a critical or even dangerous state. If only essential monitoring functions have been implemented in the secondary monitoring device, this has the advantage that the availability of the monitoring system are drastically improved, with simultaneous reduction of the costs.

In the case of the disclosed monitoring system, a cost-reducing benefit can likewise take effect if the secondary monitoring device provides only a reduced functionality in comparison with the primary monitoring device—that is to say, in particular, only the essential functions. This may be important, especially for transportation vehicles that support autonomous driving.

It is beneficial, furthermore, if the secondary monitoring device has a lower safety classification (or certification) than the primary monitoring device. For example, the monitoring functions (in particular, safety functions) of the secondary monitoring device may only have been developed in ASIL B, whereas the monitoring functions of the primary monitoring device have been developed in ASIL C or higher ("ASIL" stands here for Automotive Safety Integrity Level).

The respective monitoring device may be a control unit of the transportation vehicle. The control unit may also serve for regulation. The unit can, for example, receive signals (also control variables) of the battery system as input variable and can output further signals as output variable, to inspect (that is to say, control and/or regulate) control functions (in particular, switching functions) in a manner depending on the input variable. For instance, the input variable can be evaluated, to provide at least one supervisory function. Also, a control function can be inspected (for example, triggered or activated) in a manner depending on the at least one supervisory function. For the purpose of inspecting the control function and/or evaluating the input variable, the respective monitoring device may, furthermore, exhibit respective control software. In this case, the primary monitoring device can receive all of the available input variables and/or utilize all of the available output variables and/or control functions, but the secondary monitoring device can utilize only essential input variables and/or output variables and/or control functions. Hence the technical complexity can be reduced and costs can be saved, and nevertheless a very high failure safety can be guaranteed.

In the field of safety-relevant automotive engineering, failure safety is frequently demanded and is ensured by appropriate standardization. Of significance in this connection is standard ISO 26262 with the classifications QM and ASIL A to D. These classifications are utilized by the standard to recommend measures for enhancing safety. The highest requirements in terms of safety are predetermined by ASIL D. In the case of transportation vehicles driving autonomously, a maximum degree of safety is required—within the scope of the aforementioned standard, consequently ASIL D. For availability, the stated ASIL D is split up into two ASILs B(D) (that is: ASIL B of D). One of the ASILs B(D) is allotted, for example, to the availability of the battery system. Purely technically, the following significance lies behind this: the system has to guarantee a certain availability also in the case of a fault. This applies even if the control unit fails. To attain this objective, however, each element of the control unit, or of the control software, has to display the feature "ASIL quality A, B, C or D". The disclosure may, where appropriate, provide that a design according to ASIL is limited to safety-relevant monitoring functions—that is to say, the supervisory functions and/or control functions (switching functions). The disclosed embodiments may also provide that the primary monitoring device and/or the secondary monitoring device has been designed in accordance with one of the ASIL specifications (A, B, C or D) or ASIL B(D) or ASIL A(D), or in technically equivalent manner. In this case, the software of the respective monitoring device may also have been designed correspondingly.

Possible supervisory functions are, for example, at least one of the following:

ascertainment of a fault condition of the battery system in at least one battery and/or cell of the battery system, ascertainment of a charging state of at least one battery of the battery system, ascertainment of a cell voltage in at least one battery cell of the battery system, ascertainment of a battery-cell voltage in the battery system, detecting an overvoltage state of at least one battery cell of the battery system, detecting a short circuit of at least one battery cell of the battery system, comparing at least one ascertained result of at least one of the aforementioned ascertainments with a threshold value, to detect a fault condition.

In this connection, the battery may be a rechargeable battery—that is to say, a storage battery, optionally a lithium-ion storage battery. In this case, the battery may have been designed for supplying energy to electrical components of the transportation vehicle, such as, for instance, to a driver-assistance system or to an electronics module for autonomous driving. It is also possible that it is a question of a high-voltage battery that has been configured for operating an electric drive of the transportation vehicle.

Possible control functions (in particular, switching functions) are, for example, at least one of the following:

deactivating the battery system, shutting down the transportation vehicle, alerting a driver of the transportation vehicle via an instrument panel of the transportation vehicle.

It may be possible that a fault condition—that is to say, a failure—of the primary monitoring device is detected (for example, by the secondary monitoring device and/or by a battery management system, in particular, by a switching device), and in the case of positive detection of the fault condition the secondary monitoring device is partially or fully activated. By this, the monitoring system can be kept available also in the fault condition. Since normal operation no longer obtains here, formally it is not necessary to integrate each software function and hardware function into this emergency control unit (that is to say, of the secondary monitoring device). As a result, the technical effort can be distinctly reduced.

The secondary monitoring device must supervise "only" the essential monitoring functions (in particular, essential safety functions); for example, overvoltage detection. These essential monitoring functions conventionally have to be developed in ASIL C (where appropriate, also higher). To satisfy ASIL C quality, as a rule two control paths have to exist for each essential monitoring function (for example, an alarm line and a signal path and/or bus path, for example, B-CAN path). If a battery management is being developed in accordance with the disclosure with the secondary monitoring device, the secondary monitoring device must not be developed in ASIL C, but for this special case an ASIL B or ASIL A or technically equivalent quality may suffice. This also applies to the essential monitoring functions. The emergency control unit may correspondingly only be provided with essential monitoring functions that have to be developed not in ASIL C, but for this case "only" in ASIL B (or ASIL A).

It may be beneficial if, within the scope of the disclosure, the secondary monitoring device is an emergency monitoring device, in particular, an electronic emergency monitoring device, to provide, in particular, to apply actively, the reduced range of the monitoring functions, in particular, control functions and/or supervisory functions, in the event of a failure of the primary monitoring device. For this purpose, with regard to its hardware design and/or software design the secondary monitoring device has, where appropriate, a smaller range than the primary monitoring device. For instance, the secondary monitoring device extends spatially over a smaller area than the primary monitoring device, and/or exhibits a smaller range of electronic components. It may also be possible that the software of the secondary monitoring device has been designed with smaller (functional) range than the software of the primary monitoring device. This leads to a cost reduction, since only the essential monitoring functions have to be implemented.

The disclosed embodiments may provide that the secondary monitoring device is an emergency monitoring device for supervising at least one of the monitoring functions, optionally control functions and/or supervisory functions, of the primary monitoring device, so that, in the event of a failure of at least one of these supervised monitoring functions, optionally control functions and/or supervisory functions, itself to provide the corresponding monitoring function (or, to be more exact, control function and/or supervisory function). In this case, it may also be possible that the secondary monitoring device selectively replaces a failed monitoring function. Consequently it is a benefit if the secondary monitoring device can supervise individual monitoring functions, to replace the corresponding monitoring function in the event of a failure. Hence the remaining (where appropriate, greater) functional range of the primary monitoring device, and correspondingly a maximum degree of functionality, can be retained. But alternatively the secondary monitoring device can also always replace the entire reduced range of monitoring functions of the primary monitoring device.

In the case of a disclosed monitoring system it is beneficial if the secondary monitoring device is connected to the connecting arrangement only for the exchange of a reduced range of the control signals and/or supervisory signals, to provide control functions and supervisory functions that are exclusively relevant to safety. In this case, where appropriate, identical or different lines for transmitting the control signals and the supervision signals can be utilized (for example, a first electrical line for the control signals, and a second electrical line for the supervision signals). It may also be possible that at least one bus system is provided, to transmit the control signals and/or supervisory signals. This makes possible a simple and efficient structure of the monitoring system.

In the case of the disclosed monitoring system, it is furthermore possible that a switching device is provided which is electrically connected to the primary monitoring device, to detect a failure of the primary monitoring device, and is electrically connected to the secondary monitoring device, to activate the secondary monitoring device when the failure is detected. For instance, the switching device may have been integrated within the secondary monitoring device and/or within a battery management system. Alternatively or additionally, the switching device has been configured as a (separate) electronic component. It is beneficial, furthermore, if the switching device has been configured to be at least doubly or triply redundant. Hence the availability of the system can be further enhanced.

The disclosed embodiments may provide that the connecting arrangement exhibits at least one electrical interface for the exchange of supervising signals and/or control signals, in which case a first interface may have been configured for transmitting an alarm signal, and/or a second interface has been configured for transmitting a bus signal. In this case, the connecting arrangement serves for the exchange (transmission) of the supervision signals and/or control signals between the respective monitoring device and at least one further component of the battery system, that the respective monitoring device can evaluate (process), for instance, the received supervisory signals and/or control signals as receive variable and can provide, in a manner depending thereon, at least one monitoring function (where appropriate, also switching function), for example, by output of corresponding control signals as switching signals.

By way of example, the respective monitoring device can receive as supervisory signal at least one measured value that is specific to a cell voltage and/or battery voltage. The measured value can then be compared with a threshold value or can be processed in some other way, to detect an overvoltage. In a manner depending thereon, an electrical control signal can be output, for example, to an electronic switch (as a further component of the battery system), to deactivate the battery system.

Correspondingly, the control signals and/or supervisory signals may include measured values and/or voltage values of the battery cells and/or such like. The alarm signal may, for example, serve for reporting a fault condition to an electronics module of the transportation vehicle. The bus signal is, for instance, a signal of a bus system of the transportation vehicle, for example, a CAN bus system (CAN stands here for Controller Area Network). It is possible that the bus system has also been connected to further electronic components and/or control units of the transportation vehicle outside the battery system, to enable an exchange of data between these components and the monitoring system. The connecting arrangement and/or the first and/or second interface has/have, for instance, been configured as an electrical line or electronics module or such like. The primary and secondary monitoring devices may in this case each have been connected to at least one common (first and/or second) interface or to respective (first and/or second) interfaces, where appropriate also independently of one another. The connecting arrangement may consequently also have been designed in redundant manner; for example, it may exhibit at least one primary and at least one secondary (first and/or second and/or further) interface(s), also in the event of a failure of the primary interface(s) to be able to utilize the secondary interface(s). Hence a reliable and versatile integration of the monitoring system into the transportation vehicle is possible, and a communication with further components of the transportation vehicle for the purpose of improving safety is conceivable.

Likewise accorded protection is a battery management system for a battery system of a transportation vehicle. In this connection, the disclosed embodiments provide that the battery management system exhibits a disclosed monitoring system. Hence the disclosed battery management system brings about the same benefits as have been described in detail with reference to a disclosed monitoring system.

Likewise, disclosed embodiments provide a transportation vehicle that has been designed for autonomous driving and exhibits a disclosed monitoring system. The monitoring system may in this case serve for supervising a battery system of the transportation vehicle. Hence the disclosed transportation vehicle brings about the same benefits as have been described in detail with reference to a disclosed monitoring system and/or battery management system.

Disclosed embodiments also provide a method for supervising a battery system of a transportation vehicle. In this connection, the disclosed embodiments provide that the following operations are carried out in succession or in any order:

carrying out a primary monitoring of the battery system by a primary monitoring device, so that monitoring functions, optionally control functions and/or supervisory functions, for the battery system are provided, carrying out a secondary monitoring of the battery system by a secondary monitoring device, so that a reduced range of the monitoring functions, optionally control functions and/or supervisory functions, is provided if a failure—that is to say, also an at least partial failure—of the primary monitoring device is detected.

In this case, for the detection (of the failure) a switching device is provided which in the event of positive detection initiates the activation of the secondary monitoring device for the purpose of secondary monitoring (that is to say, switches to the secondary monitoring device). Hence the disclosed method brings about the same benefits as have been described in detail with reference to a disclosed monitoring system. In addition, the method may be suitable to operate a disclosed monitoring system.

In the following figures, identical reference symbols are used for the same technical features, also of different embodiments.

In FIG. 1, a transportation vehicle 2 with a battery system 3 and with a monitoring system 1 is represented schematically. The monitoring system 1 serves for inspecting—that is to say, for example, supervising and/or influencing (controlling and/or regulating)—the battery system 3 by corresponding monitoring functions. The monitoring functions are provided primarily—that is to say, in the normal state—by a primary monitoring device 10. In the event of a failure of the primary monitoring device 10, a fault condition obtains. For this case, a secondary monitoring device 20 has been integrated within the monitoring system 1. A special feature is now that the secondary monitoring device 20 merely provides a reduced range of the monitoring functions of the primary monitoring device 10, so that the technical effort and the complexity of the system can be reduced. For instance, the respective monitoring devices in this case have been integrated within a battery management system 200 of the battery system 3.

So that a monitoring is possible, the respective monitoring device can receive signals S of at least one further component in the battery system 3, and/or can also emit signals S. To enable the exchange of signals, a connecting arrangement 30 is provided. In the simplest case, the arrangement is an electrical line, but it may also, where appropriate, exhibit electrical and/or electronic interfaces. By way of example, a first interface 31 and a second interface 32 are represented, which, for example, is bus interfaces.

Moreover, a battery management system 200 may exhibit a switching device 40, to detect a failure of the primary monitoring device 10 and thereupon to activate the secondary monitoring device 20.

Figure 2:
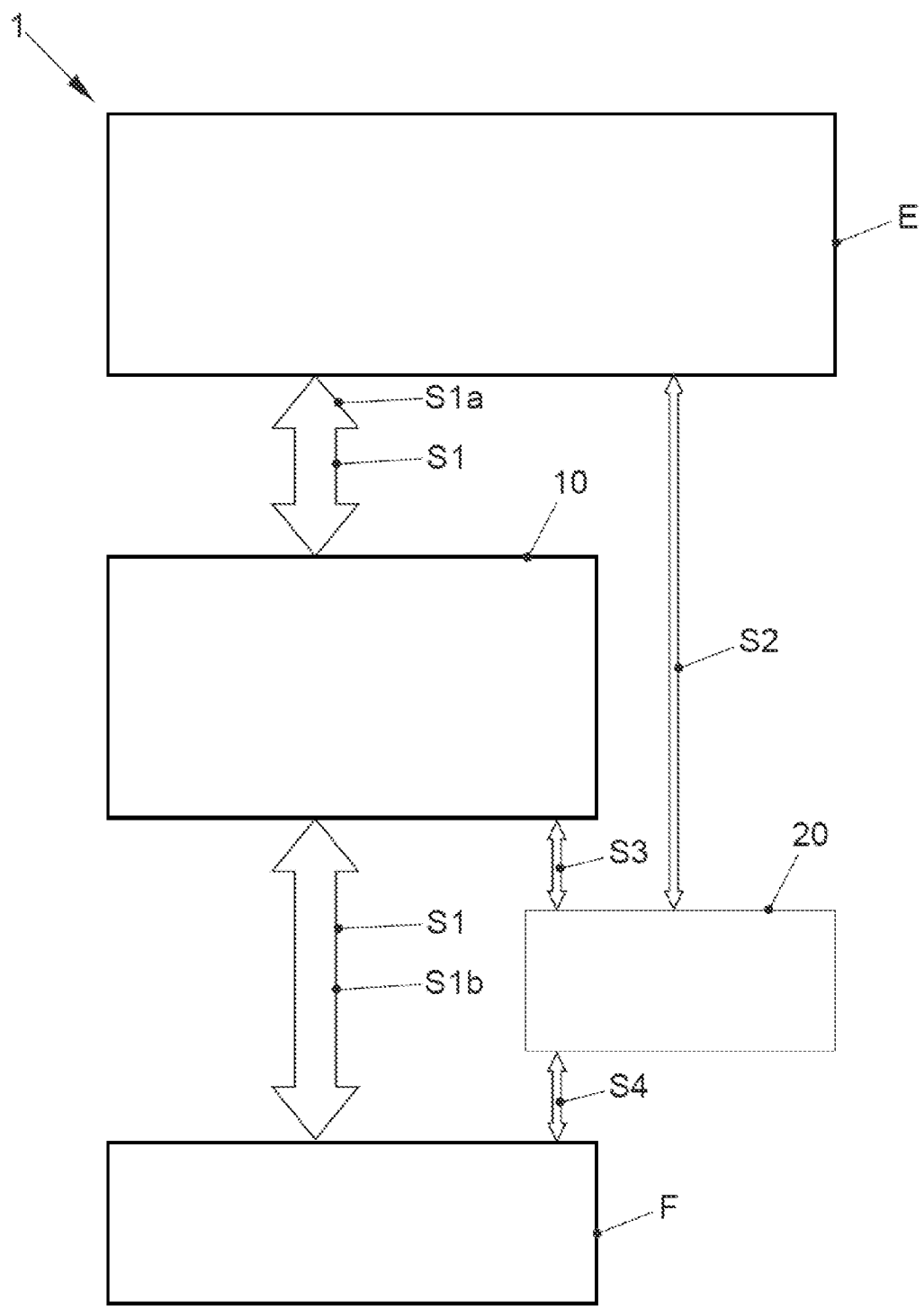
FIG. 2 shows a representation of a disclosed method.

In FIG. 2, a method for operating a monitoring system 1 is shown. In this figure it can be discerned that the signals S exchanged with the primary monitoring device 10 may include input signals S1a and output signals S1b. The input signals S1a in this case represent signals of at least one input variable (for example, cell voltage) and of a controller of the battery system 3. The at least one input variable and controller are labeled in this case by reference symbol E. The primary monitoring device 10 can process these input signals S1a and can output the output signals S1b in a manner depending on the processing, to activate at least one switching function F. The switching function F serves, for example, for providing at least one monitoring function—that is to say, supervisory function and/or control function. Since often not all of the supervisory functions and/or control functions are needed, but only the essential supervisory functions and/or control functions, to provide a sufficient degree of safety for the transportation vehicle 2, a secondary monitoring device 20 can provide a reduced range of these supervisory functions and/or control functions (or monitoring functions). For this purpose, the secondary monitoring device 20 can receive a reduced range of the signals and control variables S2 and can output, in a manner depending thereon, the switching signals S4. It may also be possible that the secondary monitoring device 20 receives supervisory signals S3, to detect a failure of the primary monitoring device 10 and then to replace the failed (essential) monitoring function.

The foregoing elucidation of the practical forms describes the present disclosure exclusively within the context of examples. Individual features of the practical forms, to the extent that they are technically meaningful, can of course be combined freely with one another without departing from the scope of the present disclosure.

LIST OF REFERENCE SYMBOLS 1 monitoring system
2 transportation vehicle
3 battery system
10 primary monitoring device, primary control unit
20 secondary monitoring device, secondary control unit
30 connecting arrangement
31 first interface
32 second interface
40 switching device
200 battery management system
E input variables and controller
F switching functions
S signal
S1 standard range, signals and control variables
S1a input signals
S1b output signals
S2 reduced range, signals and control variables
S3 supervisory signals
S4 switching signals

The invention claimed is:

1. A monitoring system for a battery system of a transportation vehicle, comprising:
a primary monitoring device for providing control functions and supervisory functions for the battery system;
a connecting arrangement for the exchange of control signals and supervisory signals with the primary monitoring device, the connecting arrangement being electrically connected to the primary monitoring device for this purpose; and
a switching device electrically connected to the primary monitoring device to detect a failure of the primary monitoring device and electrically connected to a secondary monitoring device to activate a reduced range of the control signals and/or supervisory signals to provide control functions and supervisory functions of the secondary monitoring device to replace the primary monitoring device in response to the failure being detected, wherein the secondary monitoring device for providing the reduced range of the control functions and supervisory functions is electrically connected to the connecting arrangement.

2. The monitoring system of claim 1, wherein the secondary monitoring device is an emergency monitoring device to provide the reduced range of the control functions and/or supervisory functions in response to a failure of the primary monitoring device.

3. The monitoring system of claim 1, wherein the secondary monitoring device is an emergency monitoring device for supervising at least one of the control functions and/or supervisory functions of the primary monitoring device to provide the corresponding control function and/or supervisory function in response to a failure of the at least one of the supervised control functions and/or supervisory functions.

4. The monitoring system of claim 1, wherein the secondary monitoring device is connected to the connecting arrangement only for the exchange of a reduced range of the control signals and/or supervisory signals to provide control functions and supervisory functions that are exclusively relevant to safety.

5. The monitoring system of claim 1, wherein the connecting arrangement exhibits at least one electrical interface for the exchange of supervising signals and/or control signals, a first interface configured for transmitting an alarm signal and a second interface configured for transmitting a bus signal.

6. A battery management system for a battery system of a transportation vehicle, wherein the battery management system exhibits a monitoring system, wherein the monitoring system comprises:

a primary monitoring device for providing control functions and supervisory functions for the battery system; and a connecting arrangement for the exchange of control signals and supervisory signals with the primary monitoring device, the connecting arrangement being electrically connected to the primary monitoring device for this purpose; and a switching device electrically connected to the primary monitoring device to detect a failure of the primary monitoring device and electrically connected to a secondary monitoring device to activate a reduced range of the control signals and/or supervisory signals to provide control functions and supervisory functions of the secondary monitoring device to replace the primary monitoring device in response to the failure being detected, wherein the secondary monitoring device for providing the reduced range of the control functions and supervisory functions is electrically connected to the connecting arrangement.

7. The battery system of claim 6, wherein the secondary monitoring device is an emergency monitoring device to provide the reduced range of the control functions and/or supervisory functions in response to a failure of the primary monitoring device.

8. The battery system of claim 6, wherein the secondary monitoring device is an emergency monitoring device for supervising at least one of the control functions and/or supervisory functions of the primary monitoring device to provide the corresponding control function and/or supervisory function in response to a failure of the at least one of the supervised control functions and/or supervisory functions.

9. The battery system of claim 6, wherein the secondary monitoring device is connected to the connecting arrangement only for the exchange of a reduced range of the control signals and/or supervisory signals to provide control functions and supervisory functions that are exclusively relevant to safety.

10. The battery system of claim 6, wherein the connecting arrangement exhibits at least one electrical interface for the exchange of supervising signals and/or control signals, a first interface configured for transmitting an alarm signal and a second interface configured for transmitting a bus signal.

11. A transportation vehicle for autonomous driving, the transportation vehicle comprising a monitoring system, wherein the monitoring system comprises:

a primary monitoring device for providing control functions and supervisory functions for the battery system; and a connecting arrangement for the exchange of control signals and supervisory signals with the primary monitoring device, the connecting arrangement being electrically connected to the primary monitoring device for this purpose; and a switching device electrically connected to the primary monitoring device to detect a failure of the primary monitoring device and electrically connected to a secondary monitoring device to activate a reduced range of the control signals and/or supervisory signals to provide control functions and supervisory functions of the secondary monitoring device to replace the primary monitoring device in response to the failure being detected, wherein the secondary monitoring device for providing the reduced range of the control functions and supervisory functions is electrically connected to the connecting arrangement.

12. The transportation vehicle of claim 11, wherein the secondary monitoring device is an emergency monitoring device to provide the reduced range of the control functions and/or supervisory functions in response to a failure of the primary monitoring device.

13. The transportation vehicle of claim 11, wherein the secondary monitoring device is an emergency monitoring device for supervising at least one of the control functions and/or supervisory functions of the primary monitoring device to provide the corresponding control function and/or supervisory function in response to a failure of the at least one of the supervised control functions and/or supervisory functions.

14. The transportation vehicle of claim 11, wherein the secondary monitoring device is connected to the connecting arrangement only for the exchange of a reduced range of the control signals and/or supervisory signals to provide control functions and supervisory functions that are exclusively relevant to safety.

15. The transportation vehicle of claim 11, wherein the connecting arrangement exhibits at least one electrical interface for the exchange of supervising signals and/or control signals, a first interface configured for transmitting an alarm signal and a second interface configured for transmitting a bus signal.

16. A method for supervising a battery system of a transportation vehicle, the method comprising:

carrying out a primary monitoring of the battery system by a primary monitoring device so that control functions and supervisory functions for the battery system are provided, detecting by a switching device electrically connected to the primary monitoring device a failure of the primary monitoring device and activating a reduced range of the control signals and/or supervisory signals to provide control functions and supervisory functions of the secondary monitoring device to replace the primary monitoring device in response to the failure being detected; and carrying out a secondary monitoring of the battery system by a secondary monitoring device so that the reduced range of the control functions and supervisory functions is provided in response to a failure of the primary monitoring device being detected.

17. The method of claim 16, wherein the secondary monitoring device is an emergency monitoring device to provide the reduced range of the control functions and/or supervisory functions in response to a failure of the primary monitoring device.

18. The method of claim 16, wherein the secondary monitoring device is an emergency monitoring device for supervising at least one of the control functions and/or supervisory functions of the primary monitoring device to provide the corresponding control function and/or supervisory function in response to a failure of the at least one of the supervised control functions and/or supervisory functions.

19. The method of claim 16, wherein the secondary monitoring device is connected to the connecting arrangement only for the exchange of a reduced range of the control signals and/or supervisory signals to provide control functions and supervisory functions that are exclusively relevant to safety.

20. The method of claim 16, wherein the connecting arrangement exhibits at least one electrical interface for the exchange of supervising signals and/or control signals, a first interface configured for transmitting an alarm signal and a second interface configured for transmitting a bus signal.

\* \* \* \* \*